(12) United States Patent
Liu et al.

(10) Patent No.: US 9,739,451 B2
(45) Date of Patent: Aug. 22, 2017

(54) ALIGNMENT DEVICE AND ALIGNMENT METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jinshan Liu, Beijing (CN); Liguang Deng, Beijing (CN); Zhen Chen, Beijing (CN); Quanhua He, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/328,804

(22) PCT Filed: Jan. 16, 2015

(86) PCT No.: PCT/CN2015/070847
§ 371 (c)(1),
(2) Date: Jan. 24, 2017

(87) PCT Pub. No.: WO2016/045267
PCT Pub. Date: Mar. 31, 2016

(65) Prior Publication Data
US 2017/0211782 A1    Jul. 27, 2017

(30) Foreign Application Priority Data
Sep. 24, 2014  (CN) .......................... 2014 1 0494145

(51) Int. Cl.
F21V 11/02 (2006.01)
H05K 1/18 (2006.01)

(52) U.S. Cl.
CPC ............. *F21V 11/02* (2013.01); *H05K 1/189* (2013.01)

(58) Field of Classification Search
CPC . F21V 11/02; H05K 1/189; G02F 1/13; G02F 1/1303; G02B 27/22; G02B 7/003; G02B 27/2214; H04N 13/00; G01J 3/463
See application file for complete search history.

(56) References Cited

U.S. PATENT DOCUMENTS

| | | | | |
|---|---|---|---|---|
| 9,482,893 | B2* | 11/2016 | Zheng | G03F 7/325 |
| 2014/0073214 | A1* | 3/2014 | Wu | G02B 26/08 |
| | | | | 445/24 |
| 2016/0252737 | A1* | 9/2016 | Wu | G02B 27/22 |
| | | | | 359/463 |

FOREIGN PATENT DOCUMENTS

| | | |
|---|---|---|
| CN | 102196658 A | 9/2011 |
| CN | 102299089 A | 12/2011 |

(Continued)

OTHER PUBLICATIONS

International Search Report dated Jun. 15, 2015 corresponding to International application No. PCT/CN2015/070847.

*Primary Examiner* — Bao Q Truong
(74) *Attorney, Agent, or Firm* — Nath, Goldberg & Meyer; Joshua B. Goldberg

(57) ABSTRACT

The present application discloses an alignment device and an alignment method for accurately aligning goldfingers of a flexible printed circuit board with electrodes of a substrate to be aligned under a manual pressing mode. The alignment device comprises a light regulating member and a light source provided at a side of the light regulating member. The light regulating member comprises a plurality of shading (Continued)

regions and a plurality of transmitting regions alternately provided along a length direction of the light regulating member. The plurality of transmitting regions have shapes identical to those of electrodes on a substrate to be aligned, and positions of the plurality of transmitting regions are corresponding to those of the plurality of electrodes on the substrate to be aligned.

16 Claims, 2 Drawing Sheets

(56) References Cited

FOREIGN PATENT DOCUMENTS

| | | |
|---|---|---|
| CN | 103943651 A | 7/2014 |
| JP | 2007208163 A | 8/2007 |
| JP | 2007234872 A | 9/2007 |

\* cited by examiner

ALIGNMENT DEVICE AND ALIGNMENT METHOD

This is a National Phase Application filed under 35 U.S.C. 371 as a national stage of PCT/CN2015/070847, filed Jan. 16, 2015, an application claiming the benefit of Chinese Application No. 201410494145.1, filed Sep. 24, 2014, the content of each of which is hereby incorporated by reference in its entirety.

TECHNICAL FIELD

The present application relates to the field of fabrication of display panels, and in particular relates to an alignment device and an alignment method for a display panel.

BACKGROUND

A driving circuit of a display panel mainly includes gate lines and data lines. When a gate line is at a high level, a thin-film transistor is turned on, and a data line charges a pixel electrode; when the gate line is at a low level, the thin-film transistor is turned off, the data line stops charging the pixel electrode, and a storage capacitor supplies power to the pixel electrode.

Due to coupling effect of a common electrode, a certain voltage drop occurs across a data line. Influenced by the voltage drop, voltages at both terminals of the data line are not uniform, which leads to phenomena of picture flickering on the display panel.

A current solution is as follows: for a substrate in a chip-on-glass (COG) state, a flexible printed circuit board (FPC) is manually pressed onto the substrate using a jig such that goldfingers on the flexible printed circuit board are aligned with electrodes on the substrate. Then a voltage of the common electrode is pre-written into a driving chip by multi-time programmable (MTP) writing operation, to offset the voltage drop across the data line.

According to the prior art, the substrate is first placed on a jig, a pressure head with the flexible printed circuit board mounted thereon is then pressed onto the substrate manually. The screen is switched to a jitter test picture after being lightened, a value of the voltage of the common electrode is adjusted until the picture jitter is minimized, and the adjusted value of the voltage of the common electrode is then written into the driving chip.

Because alignment accuracy of the manual pressing is not high, the goldfingers on the flexible printed circuit board and the electrodes on the substrate cannot be aligned completely accurately as a result. For example, as shown in FIG. 1, there is an alignment deviation between a goldfinger 1 and an electrode 2. In this case, the circuit can still be turned on, and the screen can still be lightened as well, but a contact resistance at this time between the goldfinger 1 on the flexible printed circuit board and the electrode 2 on the substrate differs from a contact resistance between the goldfinger 1 on the flexible printed circuit board laminated automatically by a machine and the electrode 2 on the substrate during a subsequent manufacturing process.

FIG. 2 schematically illustrates a case where a goldfinger 1 and an electrode 2 laminated automatically by a machine are aligned accurately. In this case, the contact resistance between the goldfinger 1 and the electrode 2 is different from the contact resistance between the goldfinger 1 and the electrode 2 shown in FIG. 1. This will result in that the voltage of the common electrode written into the driving chip in a COG state is not suitable for a subsequent FPC-on-glass (FOG) state, thus the phenomena of picture flickering cannot be truly improved.

SUMMARY

An object of the present application is to provide an alignment device and an alignment method capable of accurately aligning goldfingers on a flexible printed circuit board with electrodes on a substrate, so as to inhibit flickering phenomena of displayed pictures caused by an inaccurate prewritten voltage of a common electrode.

According to an aspect of the present application, there is provided an alignment device, comprising a light regulating member and a light source provided at a side of the light regulating member. The light regulating member comprises a plurality of shading regions and a plurality of transmitting regions alternately provided along a length direction of the light regulating member. The plurality of transmitting regions have shapes identical to those of electrodes on a substrate to be aligned, and positions of the plurality of transmitting regions are corresponding to those of the plurality of electrodes on the substrate to be aligned.

According to an embodiment of the present application, the light source may be a visible light source.

According to an embodiment of the present application, the alignment device may further comprise a base for placing the substrate to be aligned, and the light source and the light regulating member are provided at two sides of the base, respectively. The base may comprise a mount area corresponding to the light regulating member, and light emitted by the light source is able to pass through the mount area.

According to an embodiment of the present application, the light regulating member may be attached onto the mount area.

According to an embodiment of the present application, the light regulating member may comprise a plurality of black tapes and a plurality of transparent tapes alternately arranged along the length direction of the light regulating member, to serve as the plurality of shading regions and the plurality of transmitting regions, respectively.

According to an embodiment of the present application, a plurality of positioning members may be provided on the base to define a position for the substrate to be aligned, such that the plurality of electrodes on the substrate to be aligned overlap the plurality of transmitting regions.

According to an embodiment of the present application, the alignment device may further comprise a moving member located above the base, for moving a flexible printed circuit board to a position above the substrate to be aligned, and causing a plurality of goldfingers on the flexible printed circuit board to be aligned and in contact with the plurality of electrodes on the substrate to be aligned.

According to an embodiment of the present application, the base and the light regulating member may be formed as an integrated structure.

According to another aspect of the present application, there is provided an alignment method using an alignment device, the alignment device comprising a light regulating member and a light source provided at a side of the light regulating member, the light regulating member comprising a plurality of shading regions and a plurality of transmitting regions alternately provided along a length direction of the light regulating member, wherein the plurality of transmitting regions have shapes identical to those of electrodes on a substrate to be aligned, and positions of the plurality of transmitting regions are corresponding to those of the plurality of electrodes on the substrate to be aligned. The alignment method comprises steps of: placing the substrate to be aligned on the alignment device such that the plurality of electrodes on the substrate to be aligned overlap the plurality of transmitting regions of the light regulating member, and turning on the light source; pressing a flexible printed circuit board onto the substrate to be aligned, and aligning a plurality of goldfingers on the flexible printed circuit board with the plurality of electrodes on the substrate to be aligned; and observing whether there is light leak at edges of the goldfingers.

According to an embodiment of the present application, the alignment method may further comprise a step of: when it is observed that there is light leak at the edges of the goldfingers, adjusting a position of the flexible printed circuit board until there is no light leak at the edges of the goldfingers.

In the present application, position of a flexible printed circuit board is adjusted by using a light source and a light regulating member, so that goldfingers on the flexible printed, circuit board and electrodes on the substrate are aligned, accurately, thus, contact resistances between the goldfingers and the electrodes under a manual pressing mode are consistent with contact resistances between the electrodes and the goldfingers of the flexible printed circuit board automatically laminated by a machine in a subsequent manufacturing process. Therefore, a voltage of a common electrode prewritten into a driving chip under the manual pressing mode is suitable for the subsequent manufacturing process as well, so as to effectively inhibit flickering phenomena of displayed pictures caused by an inaccurate prewritten voltage of the common electrode.

BRIEF DESCRIPTION OF THE FIGURES

The accompanying drawings, which constitute a part of the specification, are provided for further understanding of the present application, and for explaining the present application along with the following specific implementations, but not intended to limit the present application.

DETAILED DESCRIPTION

The specific implementations of the present application will be described in detail below in conjunction with the drawings. It should be understood that specific implementations to be described herein are merely used for illustrating and interpreting the present application but not for limiting the present application.

Figure 1:
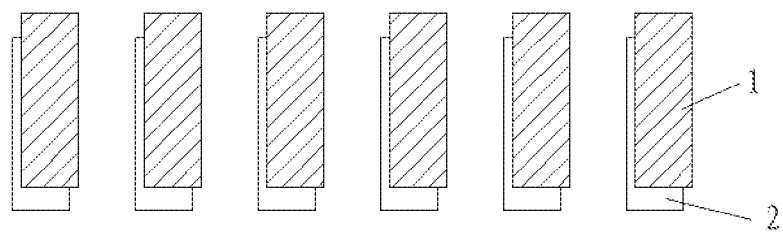
FIG. 1 is a schematic diagram schematically illustrating alignment deviations existing between goldfingers on a flexible printed circuit board and electrodes on a substrate in a manual pressing mode according to the prior art.
Figure 2:
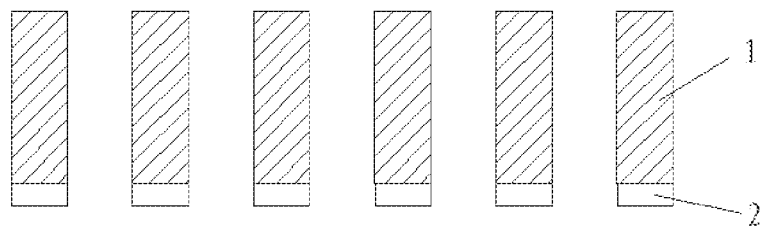
FIG. 2 schematically illustrates accurate alignment between goldfingers on a flexible printed circuit board and electrodes on a substrate.
Figure 3:
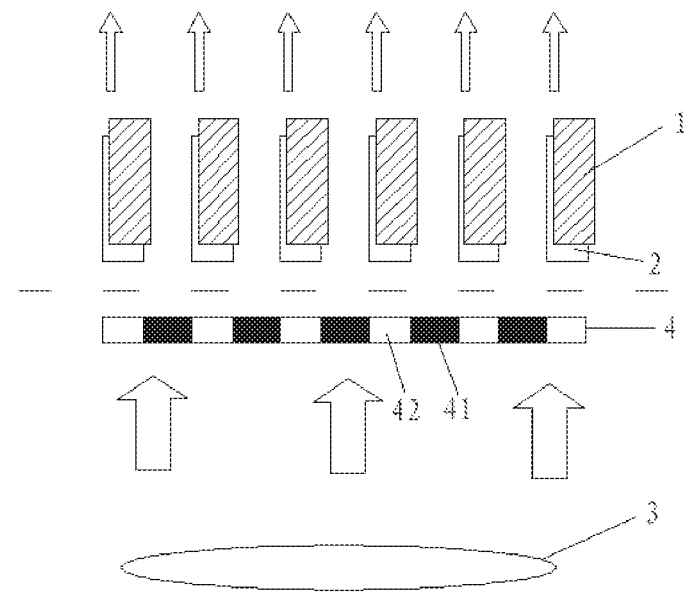
FIG. 3 is a schematic diagram of aligning goldfingers with electrodes using an alignment device according to an embodiment of the present application.
Figure 4:
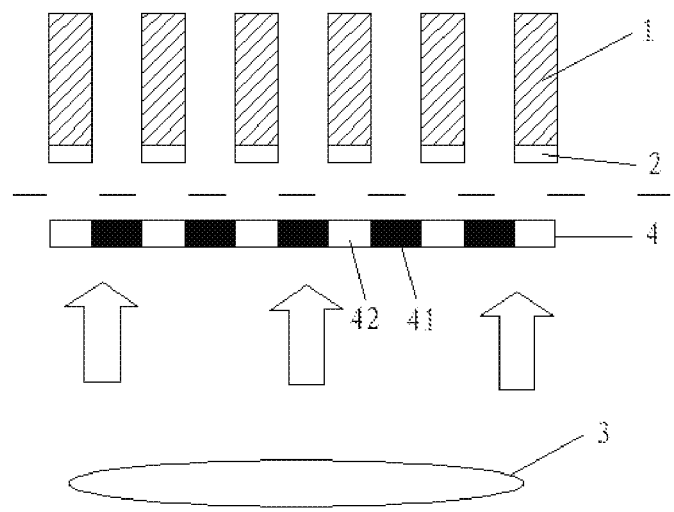
FIG. 4 is another schematic diagram of aligning goldfingers with electrodes using an alignment device according to an embodiment of the present application.

FIGS. 3 and 4 are schematic diagrams of aligning goldfingers with electrodes using an alignment device according to an embodiment of the present application.

As shown in FIGS. 3 and 4, the alignment device includes a light regulating member 4 and a light source 3 provided at a side of the light regulating member 4. The light regulating member 4 includes a plurality of shading regions 41 and a plurality of transmitting regions 42 alternately provided along a length direction of the light regulating member 4. The transmitting regions 42 have shapes identical to those of electrodes 2 on a substrate to be aligned, and positions of the plurality of transmitting regions 42 are corresponding to those of the plurality of electrodes 2 on the substrate to be aligned. Here, the substrate to be aligned is a glass substrate, and the electrodes on the substrate to be aligned are made of a light-transmissive material.

Typically, the electrodes 2 on the substrate to be aligned are bar-shaped electrodes that are arranged uniformly, thus the light regulating member 4 may include the plurality of shading regions 41 and the plurality of transmitting regions 42 which are alternately arranged, wherein positions and shapes of the plurality of transmitting regions 42 are in one-to-one correspondence with positions and shapes of the plurality of electrodes 2 on the substrate to be aligned. That is to say, the transmitting regions 42 may have widths identical to those of the electrodes 2. In practical production, shapes and positions of goldfingers 1 are usually identical to shapes and positions of the electrodes 2, i.e., the goldfingers 1 may also have widths identical to those of the electrodes 2.

When the alignment device according to the present application is used, first the plurality of electrodes 2 on the substrate to be aligned need to overlap the plurality of transmitting regions 42 on the light regulating member 4. In FIGS. 3 and 4, for convenience of description, a cross-sectional view of the light regulating member 4 is shown below a dashed line, and a plan view of the goldfingers 1 and the electrodes 2 is shown above the dashed line, whereas in practical situations, the electrodes 2 and the transmitting regions 42 are placed completely overlapping one another.

As shown by thick arrows in FIG. 3, the light source 3 emits light towards the light regulating member 4, the shading regions 41 on the light regulating member 4 can prevent the light from passing therethrough, and the transmitting regions 42 can allow the light to be transmitted to positions where the goldfingers 1 contact the electrodes 2. If there are alignment deviations between the goldfingers 1 and the electrodes 2, as shown in FIG. 3, light leak will occur at edges of the goldfingers 1 (as shown by thin arrows). In this case, positions of the goldfingers 1 need to be adjusted until there is no light leak at the edges of the goldfingers 1, as shown in FIG. 4.

The alignment device provided by the present application is mainly used to manually press a flexible printed circuit board to prewrite a value of a voltage of a common electrode into a driving chip. In a subsequent manufacturing process, since the flexible printed circuit board is automatically laminated using a machine, and a CCD camera is provided on the machine to capture an alignment image (i.e. an image of the aligned goldfingers 1 and the electrodes 2), automatic lamination of the flexible printed circuit board by the machine can ensure accurate alignment between the goldfingers 1 and the electrodes 2.

In the present application, the position of the flexible printed circuit board is adjusted by using the light source 3 and the light regulating member 4, so that the goldfingers 1 on the flexible printed circuit board and the electrodes 2 on the substrate are aligned accurately in a case of manual pressing, thus contact resistances between the goldfingers 1 and the electrodes 2 under the manual pressing mode are consistent with contact resistances between the electrodes 2 and the goldfingers 1 of the flexible printed circuit board automatically laminated by a machine in a subsequent manufacturing process. Therefore, a voltage of the common electrode prewritten into the driving chip under the manual pressing mode is suitable for the subsequent manufacturing process as well, so as to effectively inhibit flickering phenomena of displayed pictures caused by an inaccurate prewritten voltage of the common electrode.

The light source 3 may be a visible light source, so as to be observed directly by human eyes. Compared to other light sources, a visible light source can save related auxiliary observation apparatuses, thus, the operation is simple, and costs are reduced.

Figure 5:
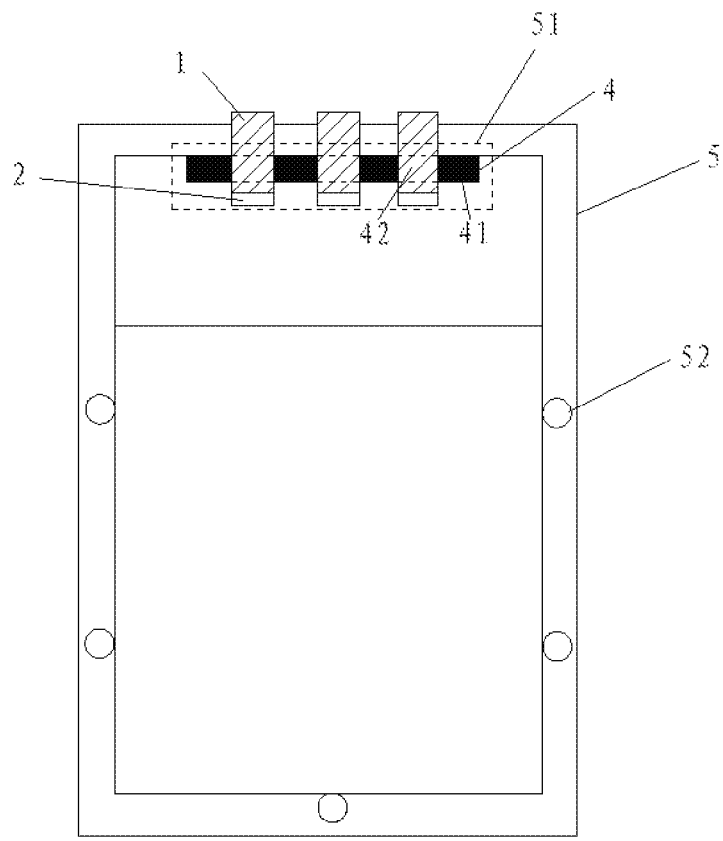
FIG. 5 is a schematic diagram of aligning goldfingers with electrodes using an alignment device according to another embodiment of the present application.

FIG. 5 is a schematic diagram of aligning goldfingers with electrodes using an alignment device according to another embodiment of the present application.

In an embodiment shown in FIG. 5, the alignment device further includes a base 5 for placing a substrate to be aligned, and the light source (now shown) and the light regulating member 4 are provided at two sides of the base 5, respectively. The base 5 includes a mount area 51 corresponding to the light regulating member 4, and light emitted by the light source can pass through the mount area 51. The substrate to be aligned is placed such that a plurality of electrodes 2 provided on the substrate to be aligned overlap the transmitting regions 42 in the light regulating member 4.

The light regulating member 4 may be attached onto the mount area 51. Specifically, the light regulating member 4 may include a plurality of black tapes and a plurality of transparent tapes alternately arranged along its length direction, to serve as a plurality of shading regions and a plurality of transmitting regions, respectively. Regions with black tapes attached thereto may serve as the shading regions 41, and regions with transparent tapes attached thereto may serve as the transmitting regions 42.

For example, an existing backlight module has a black strip-like tape for shading light. Materials of the above-described tapes include a PET base material exhibiting its color and a resin adhesive on a surface of the base material. To fabricate the light regulating member 4, black tapes and transparent tapes are cut according to widths of the electrodes 2, and then arranged alternately on the mount area 51 according to positions of the electrodes 2.

Alternatively, the light regulating member 4 may include a transparent body and black tapes attached onto the transparent body at intervals. Regions with black tapes attached thereto may serve as the shading regions 41, and regions without black tapes attached thereto may serve as the transmitting regions 42.

Further, the mount area 51 may also be a through hole or a groove provided on an upper surface of the base 5, and the light regulating member 4 may be embedded into the mount area 51 such that an supper surface of the light regulating member 4 is substantially flush with the upper surface of the base.

A plurality of positioning members 52 may be provided on the base 5, for defining a position for the substrate to be aligned, such that the plurality of electrodes 2 on the substrate to be aligned overlap the plurality of transmitting regions 42 on the light regulating member 4. The positioning members 52 may also serve as fastening members that fasten the substrate to be aligned to the base 5.

A way in which the goldfingers 1 are aligned with the electrodes 2 using the alignment device of the embodiment shown in FIG. 5 is much the same as those using the alignment devices of the embodiments shown in FIGS. 3 and 4, and is not repeated herein.

Further, the alignment device according to an embodiment of the present application may further include a moving member (not shown) above the base 5, for moving the flexible printed circuit board to a position above the substrate to be aligned and causing the goldfingers 1 on the flexible printed circuit board to be aligned and in contact with the electrodes 2 on the substrate to be aligned. Generally, the flexible printed circuit board is installed on the moving member.

Further, according to an embodiment of the present application, the base 5 and the light regulating member 4 may be formed as an integrated structure, that is, formed by an integrated molding process. For example, the shading regions with predetermined patterns may be coated or sputtered directly on the base 5.

The present application further provides an alignment method using an alignment device, including steps of: placing a substrate to be aligned on the alignment device such that a plurality of electrodes on the substrate to be aligned overlap a plurality of transmitting regions of a light regulating member of the alignment device, and turning on the light source; pressing a flexible printed circuit board onto the substrate to be aligned, and aligning a plurality of goldfingers on the flexible printed circuit board with the plurality of electrodes on the substrate to be aligned; and observing whether there is light leak at edges of the goldfingers. When it is observed that there is light leak at the edges of the goldfingers, position of the flexible printed circuit board is adjusted until there is no light leak at the edges of the goldfingers.

The alignment method according to an embodiment of the present application is described in detail below by taking the alignment device shown in FIG. 5 as an example.

First, a substrate to be aligned is placed on the base 5 according to a position defined by the positioning members 52 such that the electrodes 2 on the substrate to be aligned overlap the transmitting regions 42 on the light regulating member 4. Then, the flexible printed circuit board is installed on the moving member (not shown), and the moving member is operated such that the goldfingers 1 on the flexible printed circuit board are aligned and in contact with the electrodes 2 on the substrate to be aligned.

It is observed whether there is light leak at the edges of the goldfingers 1. When there is light leak at the edges of the goldfingers, position of the flexible printed circuit board is adjusted until there is no light leak at the edges of the goldfingers 1.

With the alignment device and the alignment method according to the inventive concept, goldfingers and electrodes can be accurately aligned under a manual pressing mode, so that contact resistances therebetween are consistent with contact resistances between the electrodes and the goldfingers of the flexible printed circuit board automatically laminated by a machine in a subsequent manufacturing process. Thus, a voltage of a common electrode prewritten in the manual pressing mode can be applied to the subsequent manufacturing process, so as to effectively inhibit flickering phenomena of displayed pictures caused by an inaccurate prewritten voltage of the common electrode.

It can be understood that the foregoing implementations are merely exemplary implementations used for describing the principle of the present application, but the present application is not limited thereto. Those of ordinary skill in the art may make various variations and modifications without departing from the spirit and essence of the present application, and these variations and modifications shall fall into the protection scope of the present application.

The invention claimed is:

1. An alignment device, comprising a light regulating member and a light source provided at a side of the light regulating member, the light regulating member comprising a plurality of shading regions and a plurality of transmitting regions alternately provided along a length direction of the light regulating member,
wherein the plurality of transmitting regions have shapes identical to those of electrodes on a substrate to be aligned, and positions of the plurality of transmitting regions are corresponding to those of the plurality of electrodes on the substrate to be aligned.

2. The alignment device according to claim 1, wherein the light source is a visible light source.

3. The alignment device according to claim 1, further comprising a base for placing the substrate to be aligned, and the light source and the light regulating member being provided at two sides of the base, respectively,
wherein the base comprises a mount area corresponding to the light regulating member, and light emitted by the light source is able to pass through the mount area.

4. The alignment device according to claim 3, wherein the light regulating member is attached onto the mount area.

5. The alignment device according to claim 4, wherein the light regulating member comprises a plurality of black tapes and a plurality of transparent tapes alternately arranged along the length direction of the light regulating member, to serve as the plurality of shading regions and the plurality of transmitting regions, respectively.

6. The alignment device according to claim 3, wherein a plurality of positioning members are provided on the base to define a position for the substrate to be aligned, such that the plurality of electrodes on the substrate to be aligned overlap the plurality of transmitting regions.

7. The alignment device according to claim 3, further comprising, above the base, a moving member for moving a flexible printed circuit board to a position above the substrate to be aligned and causing a plurality of goldfingers on the flexible printed circuit board to be aligned and in contact with the plurality of electrodes on the substrate to be aligned.

8. The alignment device according to claim 3, wherein the base and the light regulating member are formed as an integrated structure.

9. An alignment method using an alignment device, the alignment device comprising a light regulating member and a light source provided on a side of the light regulating member, the light regulating member comprising a plurality of shading regions and a plurality of transmitting regions alternately provided along a length direction of the light regulating member, wherein the plurality of transmitting regions have shapes identical to those of electrodes on a substrate to be aligned, and positions of the plurality of transmitting regions are corresponding to those of the plurality of electrodes on the substrate to be aligned, the alignment method comprising:
placing the substrate to be aligned on the alignment device such that the plurality of electrodes on the substrate to be aligned overlap the plurality of transmitting regions of the light regulating member, and turning on the light source;
pressing a flexible printed circuit board onto the substrate to be aligned, and aligning a plurality of goldfingers on the flexible printed circuit board with the plurality of electrodes on the substrate to be aligned; and
observing whether there is light leak at edges of the goldfingers.

10. The alignment method according to claim 9, further comprising:
when it is observed that there is light leak at the edges of the goldfingers, adjusting a position of the flexible printed circuit board until there is no light leak at the edges of the goldfingers.

11. The alignment device according to claim 2, further comprising a base for placing the substrate to be aligned, and the light source and the light regulating member being provided at two sides of the base, respectively,
wherein the base comprises a mount area corresponding to the light regulating member, and light emitted by the light source is able to pass through the mount area.

12. The alignment device according to claim 11, wherein the light regulating member is attached onto the mount area.

13. The alignment device according to claim 12, wherein the light regulating member comprises a plurality of black tapes and a plurality of transparent tapes alternately arranged along the length direction of the light regulating member, to serve as the plurality of shading regions and the plurality of transmitting regions, respectively.

14. The alignment device according to claim 11, wherein a plurality of positioning members are provided on the base to define a position for the substrate to be aligned, such that the plurality of electrodes on the substrate to be aligned overlap the plurality of transmitting regions.

15. The alignment device according to claim 11, further comprising, above the base, a moving member for moving a flexible printed circuit board to a position above the substrate to be aligned and causing a plurality of goldfingers on the flexible printed circuit board to be aligned and in contact with the plurality of electrodes on the substrate to be aligned.

16. The alignment device according to claim 11, wherein the base and the light regulating member are formed as an integrated structure.

* * * * *